United States Patent
Arifeen et al.

(10) Patent No.: US 11,646,286 B2
(45) Date of Patent: May 9, 2023

(54) PROCESSES FOR FORMING SELF-HEALING SOLDER JOINTS AND REPAIR OF SAME, RELATED SOLDER JOINTS, AND MICROELECTRONIC COMPONENTS, ASSEMBLIES AND ELECTRONIC SYSTEMS INCORPORATING SUCH SOLDER JOINTS

(71) Applicant: Micron Technology, Inc., Boise, ID (US)

(72) Inventors: Shams U. Arifeen, Boise, ID (US); Christopher Glancey, Boise, ID (US); Koustav Sinha, Boise, ID (US); Xiao Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/719,643

(22) Filed: Dec. 18, 2019

(65) Prior Publication Data

US 2021/0193607 A1   Jun. 24, 2021

(51) Int. Cl.
*H01L 23/00* (2006.01)

(52) U.S. Cl.
CPC ............. *H01L 24/16* (2013.01); *H01L 24/11* (2013.01); *H01L 2224/11462* (2013.01); *H01L 2224/11622* (2013.01); *H01L 2224/11849* (2013.01); *H01L 2224/13109* (2013.01); *H01L 2224/13111* (2013.01); *H01L 2224/13139* (2013.01); *H01L 2224/13147* (2013.01)

(58) Field of Classification Search
CPC .......... H01L 24/16; H01L 24/15; H01L 24/10
See application file for complete search history.

(56) References Cited

U.S. PATENT DOCUMENTS

| | | | |
|---|---|---|---|
| 5,520,752 A | 5/1996 | Lucey, Jr. et al. | |
| 5,860,585 A * | 1/1999 | Rutledge | H01L 24/11 228/254 |
| 6,130,479 A | 10/2000 | Chalco et al. | |

(Continued)

FOREIGN PATENT DOCUMENTS

WO   WO-2015098460 A1 *   7/2015   .............. H01L 24/11

OTHER PUBLICATIONS

"Metals and Alloys—Melting Temperatures" (2005) (retrieved from https://www.engineeringtoolbox.com/melting-temperature-metals-d_860.html) (Year: 2005).*

(Continued)

*Primary Examiner* — Michele Fan
(74) *Attorney, Agent, or Firm* — TraskBritt

(57) ABSTRACT

Solder joints comprising two different solder materials having different melting points, an outer solder material extending over an inner solder material bonded to a conductive pad, the inner solder material having a lower melting point than a melting point of the outer solder material and being in a solid state at substantially ambient temperature. A metal material having a higher melting point than a melting point of either solder material may coat at least a portion of the inner solder material. Microelectronic components, assemblies and electronic systems incorporating the solder joints, as well as processes for forming and repairing the solder joints are also disclosed.

10 Claims, 7 Drawing Sheets

(56) References Cited

U.S. PATENT DOCUMENTS

| | | | | |
|---|---|---|---|---|
| 6,158,644 | A * | 12/2000 | Brofman | H05K 3/3436 228/56.3 |
| 6,443,351 | B1 * | 9/2002 | Huang | H05K 3/3436 228/103 |
| 6,911,388 | B2 | 6/2005 | Kee et al. | |
| 6,998,705 | B2 | 2/2006 | Noguchi | |
| 8,070,048 | B2 | 12/2011 | Oh et al. | |
| 8,518,531 | B2 | 8/2013 | Rohatgi | |
| 8,598,464 | B2 | 12/2013 | Sakatani et al. | |
| 2003/0156969 | A1 * | 8/2003 | Choi | H05K 3/3463 420/560 |
| 2004/0087129 | A1 | 5/2004 | Chen et al. | |
| 2006/0228878 | A1 | 10/2006 | Park et al. | |
| 2007/0075410 | A1 * | 4/2007 | Chan | H01L 21/563 257/678 |
| 2009/0045523 | A1 | 2/2009 | Fan et al. | |
| 2011/0244675 | A1 * | 10/2011 | Huang | H01L 24/13 438/614 |
| 2012/0193783 | A1 * | 8/2012 | Hong | H01L 25/105 257/737 |
| 2013/0277838 | A1 * | 10/2013 | Yu | H01L 24/11 257/738 |
| 2014/0065771 | A1 * | 3/2014 | Gruber | B23K 1/0016 257/E21.506 |
| 2014/0151863 | A1 * | 6/2014 | Kim | H01L 23/3128 257/672 |
| 2014/0299231 | A1 * | 10/2014 | Chu | B23K 35/0222 148/23 |

OTHER PUBLICATIONS

"American Elements Reference Sheet: Melting Points" (retrieved from https://www.americanelements.com/meltingpoint.html on Jan. 2021) (Year: 2021).*

Definition of "otherwise", http://www.merriam-webster.com (2021) (Year: 2021).*

* cited by examiner

PROCESSES FOR FORMING SELF-HEALING SOLDER JOINTS AND REPAIR OF SAME, RELATED SOLDER JOINTS, AND MICROELECTRONIC COMPONENTS, ASSEMBLIES AND ELECTRONIC SYSTEMS INCORPORATING SUCH SOLDER JOINTS

TECHNICAL FIELD

Embodiments disclosed herein relate to conductive elements for microelectronic components and processes for forming such conductive elements. More particularly, embodiments disclosed herein relate to conductive elements in the form of self-healing solder joints, processes for forming such solder joints, and to microelectronic components, microelectronic component assemblies and electronic systems incorporating such solder joints.

BACKGROUND

Conductive elements in the form of solder joints (i.e., solder balls, solder bumps) comprising a single metal material have been used for decades to physically and electrically connect microelectronic components to one another, to substrates, and to higher level packaging. While providing relatively robust connections, as operational demands in terms of increased temperature swings in thermal cycling, ever-increasing numbers of thermal cycles during operation lifespans of electronic systems, as well as increasingly smaller microelectronic form factors with attendant smaller solder joint pitches and solder volumes per joint increase the potential for joint failure and open circuits. Severe usage environments, such as automotive applications (with extreme temperatures and longevity requirements) and server applications (with rigorous reliability and longevity requirements) may further enhance the potential for solder joint failure.

The failure mechanism for conventional solder joints in the form of reflowed masses of solder comprising a single metal material (e.g., solder balls, solder bumps) connecting, for example, a microelectronic component (e.g., a semiconductor die, an interposer) to another microelectronic component (e.g., another semiconductor die, a base wafer, a printed circuit board), is illustrated in FIGS. 1A-1C. As depicted in FIG. 1A, at time t=0, a solder mass has been heated to a liquidus state (for example, in an oven) to reflow in the presence of an appropriate flux to wet bond pad 102 of microelectronic component 100 on which the solder mass has been placed, and to terminal pad 202 of (for example) another, adjacent microelectronic component 200, to form solder joint 104 bonding to bond pad 102 and terminal pad 202 upon cooling. While not shown, solder mass is conventionally disposed on so-called under-bump metallization (UBM) on bond pad 102, the UBM comprising multiple different metal layers to ensure bonding between the metal of the bond pad and the alloy of the solder joint. As shown in FIG. 1B, in operation as the microelectronic components cycle between low and high temperatures and after a number of such thermal cycles, a crack C may commence to propagate from an outer boundary of solder joint 104 between a base portion 104B of solder joint 104 bonded to bond pad 102 and the remainder of solder joint 104R, which remains intact and firmly bonded to bond pad 102. As operation continues through more thermal cycles, the crack C continues to propagate through the solder joint 104 between the base portion 104B and the remainder of solder joint 104R until the solder joint 104 is completed cracked, resulting in discontinuity D, at best increasing resistance and weakening the joint and at worst a failed interconnect in the form of an open circuit. FIG. 2 illustrates an actual, failed solder joint showing the discontinuity in the rectangle overlay. As noted previously, with decreasing pitch length, solder joint size and bond line thickness between components as form factors shrink, the solder volume and surface area of conventional solder joints connecting microelectronic components becomes further limited and more susceptible to failure.

DETAILED DESCRIPTION

Figure 1A:
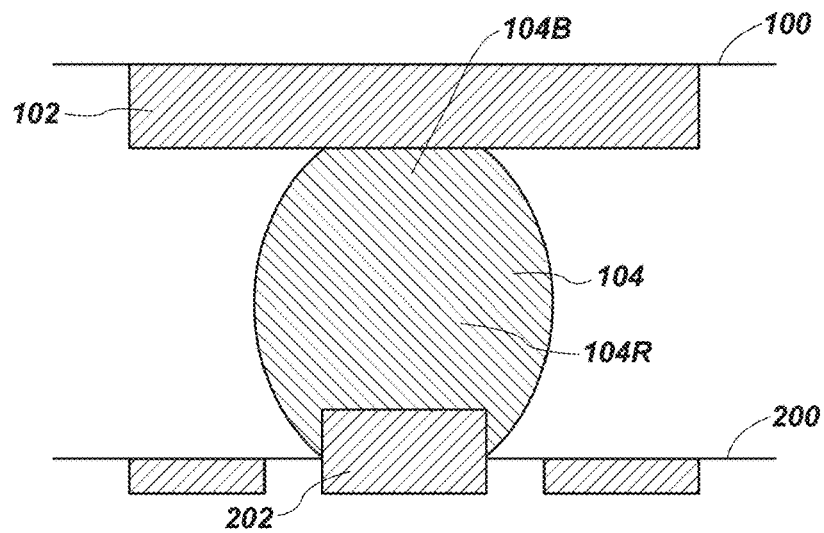
FIGS. 1A through 1C are schematic cross-sections of a conventional solder joint and progression thereof to failure during operation after a number of thermal cycles.

Solder joints are described, as well as a process for fabricating such solder joints, microelectronic components equipped with such solder joints, and electronic systems comprising microelectronic components so equipped.

The following description provides specific details, such as sizes, shapes, material compositions, and orientations in order to provide a thorough description of embodiments of the disclosure. However, a person of ordinary skill in the art will understand and appreciate that the embodiments of the disclosure may be practiced without necessarily employing these specific details, as embodiments of the disclosure may be practiced in conjunction with conventional fabrication techniques employed in the industry. In addition, the description provided below may not form a complete process flow for manufacturing solder joints, a microelectronic component equipped with such solder joints, or apparatus (e.g., microelectronic component assembly, electronic system, etc.) including such solder joints. Only those process acts and structures necessary to understand the embodiments of the disclosure are described in detail below. Additional acts to form a complete solder joint, a complete microelectronic component equipped with such solder joints, or a complete apparatus (e.g., a complete microelectronic component assembly, electronic system, etc.) including solder joints as described herein may be performed by conventional fabrication processes.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or non-linear features, and a region illustrated or described as round may include some rough and/or linear features. Moreover, sharp angles between surfaces that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale.

As used herein, the terms "comprising," "including," "containing," "characterized by," and grammatical equivalents thereof are inclusive or open-ended terms that do not exclude additional, unrecited elements or method acts, but also include the more restrictive terms "consisting of" and "consisting essentially of" and grammatical equivalents thereof. As used herein, the term "may" with respect to a material, structure, feature or method act indicates that such is contemplated for use in implementation of an embodiment of the disclosure and such term is used in preference to the more restrictive term "is" so as to avoid any implication that other, compatible materials, structures, features and methods usable in combination therewith should or must be, excluded.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, spatially relative terms, such as "beneath," "below," "lower," "bottom," "above," "over," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "over" or "above" or "on" or "on top of" other elements or features would then be oriented "below" or "beneath" or "under" or "on bottom of" the other elements or features. Thus, the term "over" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, the terms "configured" and "configuration" refer to a size, shape, material composition, orientation, and arrangement of one or more of at least one structure and at least one apparatus facilitating operation of one or more of the structure and the apparatus in a predetermined way.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein the terms "layer" and "film" mean and include a level, sheet or coating of material residing on a structure, which level or coating may be continuous or discontinuous between portions of the material, and which may be conformal or non-conformal, unless otherwise indicated.

As used herein, the term "substrate" means and includes a base material or construction upon which additional materials are formed. The substrate may be a semiconductor substrate, a base semiconductor layer on a supporting structure, a metal electrode, a semiconductor substrate having one or more materials, layers, structures, or regions formed thereon. The materials on the semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped. The term "substrate" also means and includes organic substrates, for example substrates having multiple metal layers in the form of traces and vis interposed with dielectric layers (e.g., resin-glass weave polymers). For example, conventional BGA packages include multiple die and encapsulation (e.g., epoxy molding compound (EMC)) on one side of an organize substrate and an array of solder balls on the other side.

As used herein, the terms "comprising," "including," "containing," "characterized by," and grammatical equivalents thereof are inclusive or open-ended terms that do not exclude additional, unrecited elements or method steps, but also include the more restrictive terms "consisting of" and "consisting essentially of" and grammatical equivalents thereof.

As used herein, the term "may" with respect to a material, structure, feature or method act indicates that such is contemplated for use in implementation of an embodiment of the disclosure and such term is used in preference to the more restrictive term "is" so as to avoid any implication that other, compatible materials, structures, features and methods usable in combination therewith should or must be excluded.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may comprise one or more elements.

The various illustrative logical blocks, modules, and circuits described in connection with the embodiments disclosed herein may be implemented or performed with a general purpose processor, a special purpose processor, a digital signal processor (DSP), an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor (may also be referred to herein as a host processor or simply a host) may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer is configured to execute computing instructions (e.g., software code) related to embodiments of the present disclosure.

The embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, other structure, or combinations thereof. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

As used herein, the term "microelectronic component" means and includes by way of non-limiting example, semiconductor die, die exhibiting functionality through other than semiconductive activity, microelectrical mechanical systems (MEMS) devices, substrates comprising multiple die including conventional wafers as well as other bulk substrates as mentioned above, partial wafers and substrates including more than one die location, interposers, and circuit boards, and assemblies of any of the foregoing.

In the description and for the sake of convenience, the same or similar reference numerals may be used to identify features and elements common between various drawing figures.

Figure 1B:
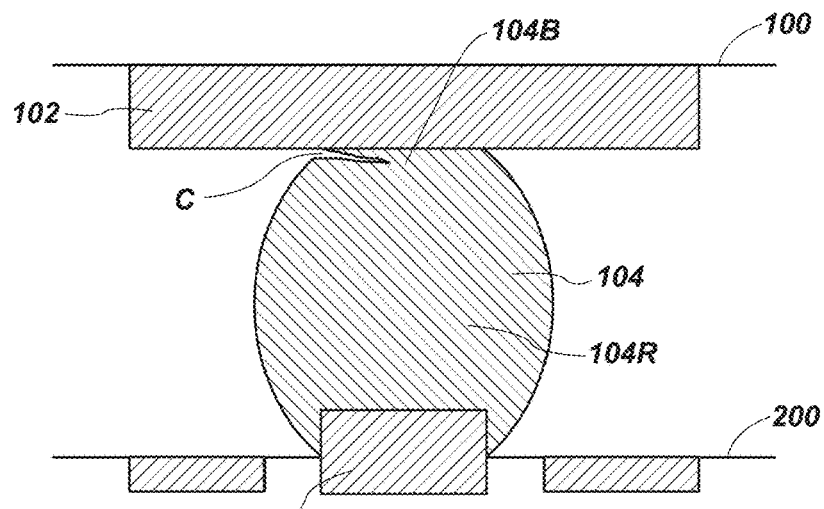
Figure 1C:
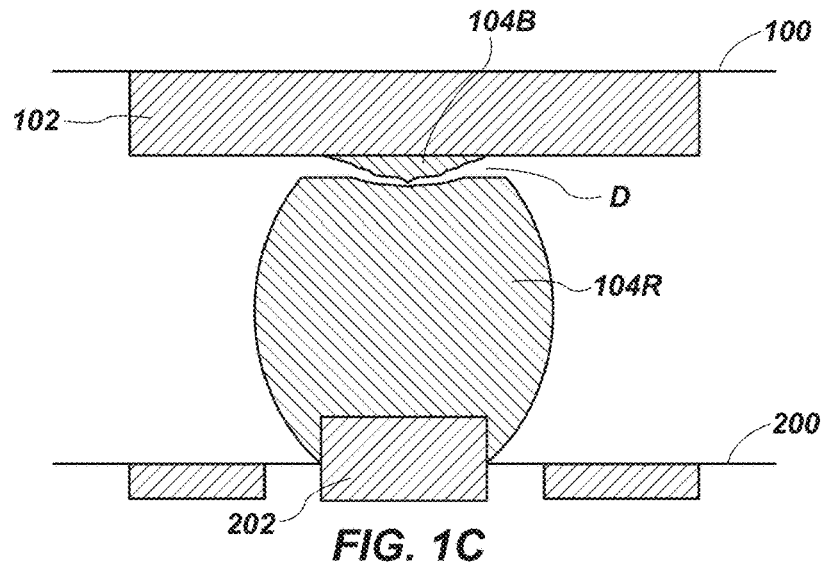
Figure 2:
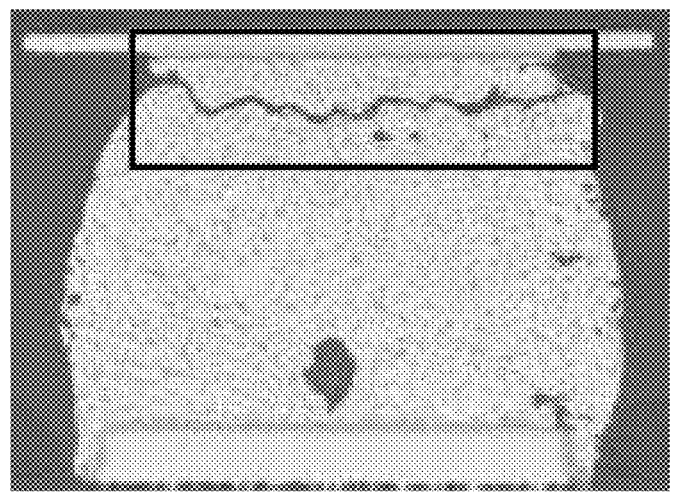
FIG. 2 is a photomicrograph of a failed solder joint showing the discontinuity in the rectangle overlay.
Figure 3A:
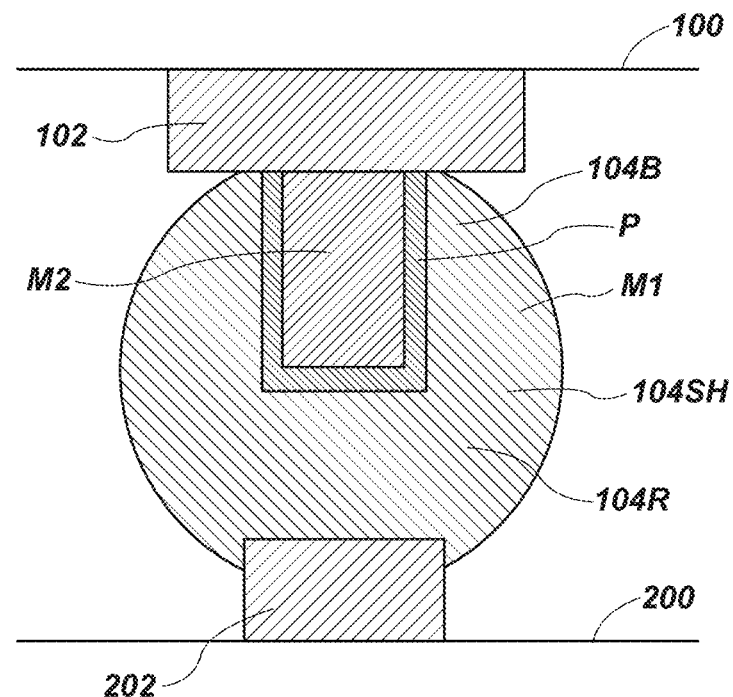
FIGS. 3A-3C are schematic cross-sections of a solder joint according to embodiments of the disclosure and progression thereof to initial cracking of the solder joint and then healing after a number of thermal cycles.
Figure 3B:
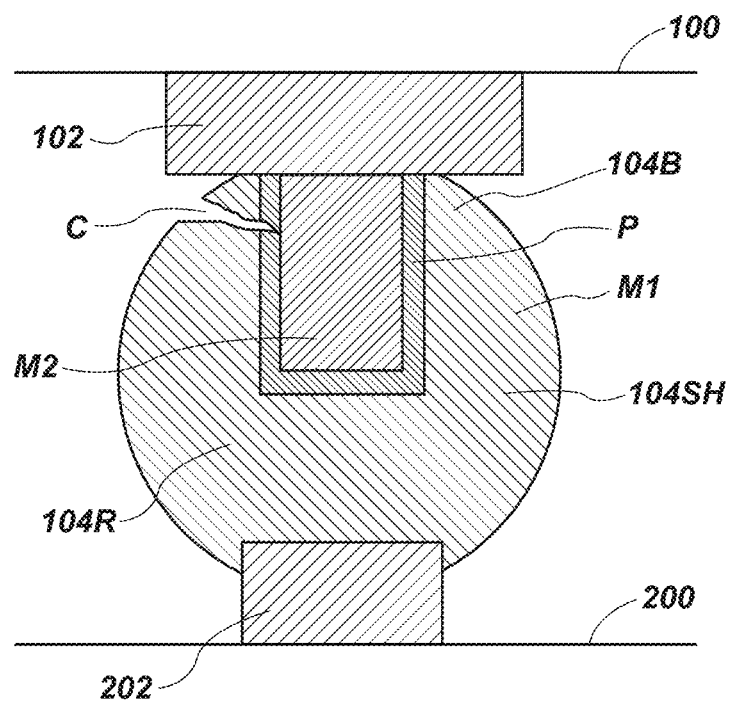
Figure 3C:
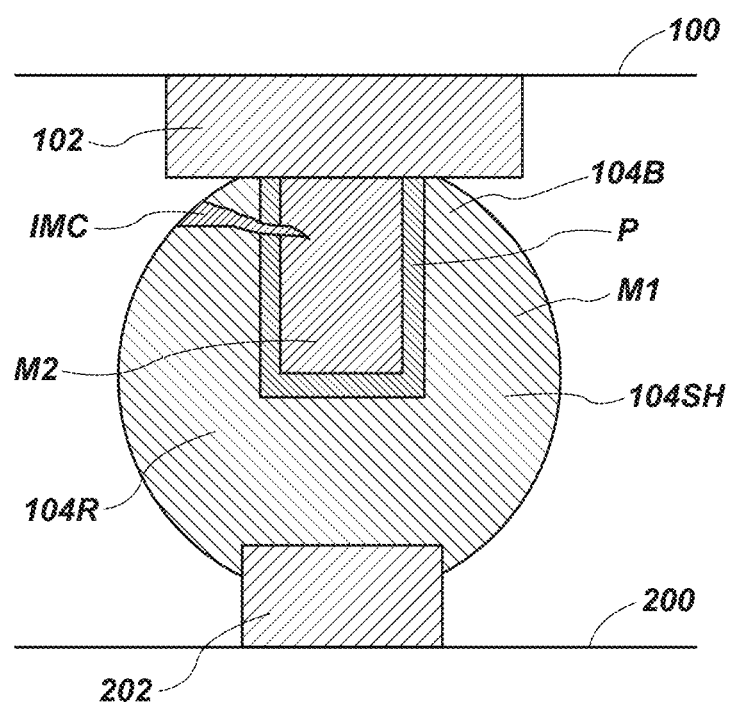

Referring now to FIGS. 3A-3C of the drawings, in FIG. 3A a self-healing solder joint 104SH is shown at time t=0 extending between a UBM-equipped bond pad 102 (of a microelectronic component 100) and terminal pad 202 of another microelectronic component 200 comprising a microelectronic component assembly. Self-healing solder joint 104SH has been formed by heating a ball or other mass of solder material M1 to a liquidus state and wetting the bond pad 102 and terminal pad 202 in the presence of flux to bond the solder to both the bond pad 102 and terminal pad 202 upon cooling of the solder material. Unlike a conventional solder joint 104 as previously described with respect to FIGS. 1A-1C, self-healing solder joint 104SH includes a second, different solder material M2 having a lower melting point than solder material M1 and being in a solid state at substantially ambient temperature (i.e., about 25° C.) but transformable to a flowable state at higher temperatures. Solder material M2 is preformed as a stud or bump on the bond pad 102 prior to application of solder material M1 and is at least partially surrounded with an protective coating P of a metal material of, for example, a wall thickness of about 0.1 μm to about 5 μm. Protective coating P may extend only around the side of solder material M2, or may cover the side and top thereof. As shown in FIG. 3B, in operation as the microelectronic components cycle between low and high temperatures, a stress crack C may commence to propagate from an outer boundary of self-healing solder joint 104SH between the base portion 104B of solder material M1 of self-healing solder joint 104SH bonded to bond pad 102 and the remainder of solder joint 104R of solder material M1 of self-healing solder joint 104SH, crack C eventually piercing protective coating P to expose solder material M2. At that point and as shown in FIG. 3C, responsive to exposure to a temperature above the melting point of solder material M2, solder material M2 will melt and wick into crack C while solder material M1 remains in a solid state, and solder material M2 may react with solder material M1 at least at a boundary with the surfaces of crack C to form a new reaction product material comprising an intermetallic compound (IMC) or a solder alloy (depending upon the compositions of M1 and M2) filling and healing the crack C. The IMC or new solder alloy may exhibit a significantly higher melting temperature than the melting temperature of either M1 or M2 and, in any case, the healed crack C provides sufficient conductivity at a low enough resistance to maintain an operable electrical connection between the two microelectronic components 100 and 200 as well as a robust physical connection.

The inventors herein have recognized that location of crack propagation may be significant to effectiveness of embodiments of the disclosure. For example, a crack in a solder joint may propagate near of bond pad or near a terminal pad. However, a solder joint may be designed in such a way that a crack, if occurring, will propagate near a desired bond pad or terminal pad on which solder material M2 resides. For example, ratio of surface areas of the bond pad and terminal pad may be tailored, the solder ball pre-form diameter selected, and the type of solder joint formed may be used to affect crack propagation location. Solder joints may be solder mask defined (SMD) or non-solder mask defined (NSMD). SMD joints are formed with a solder mask opening smaller than an associated pad (e.g., bond pad) so the solder joint is peripherally constrained by the surrounding solder mask material, while NSMD joints are formed with a solder mask opening larger than an associated pad and the solder joint bonds to the underlying pad with no peripheral constraint of solder mask material.

Figure 4:
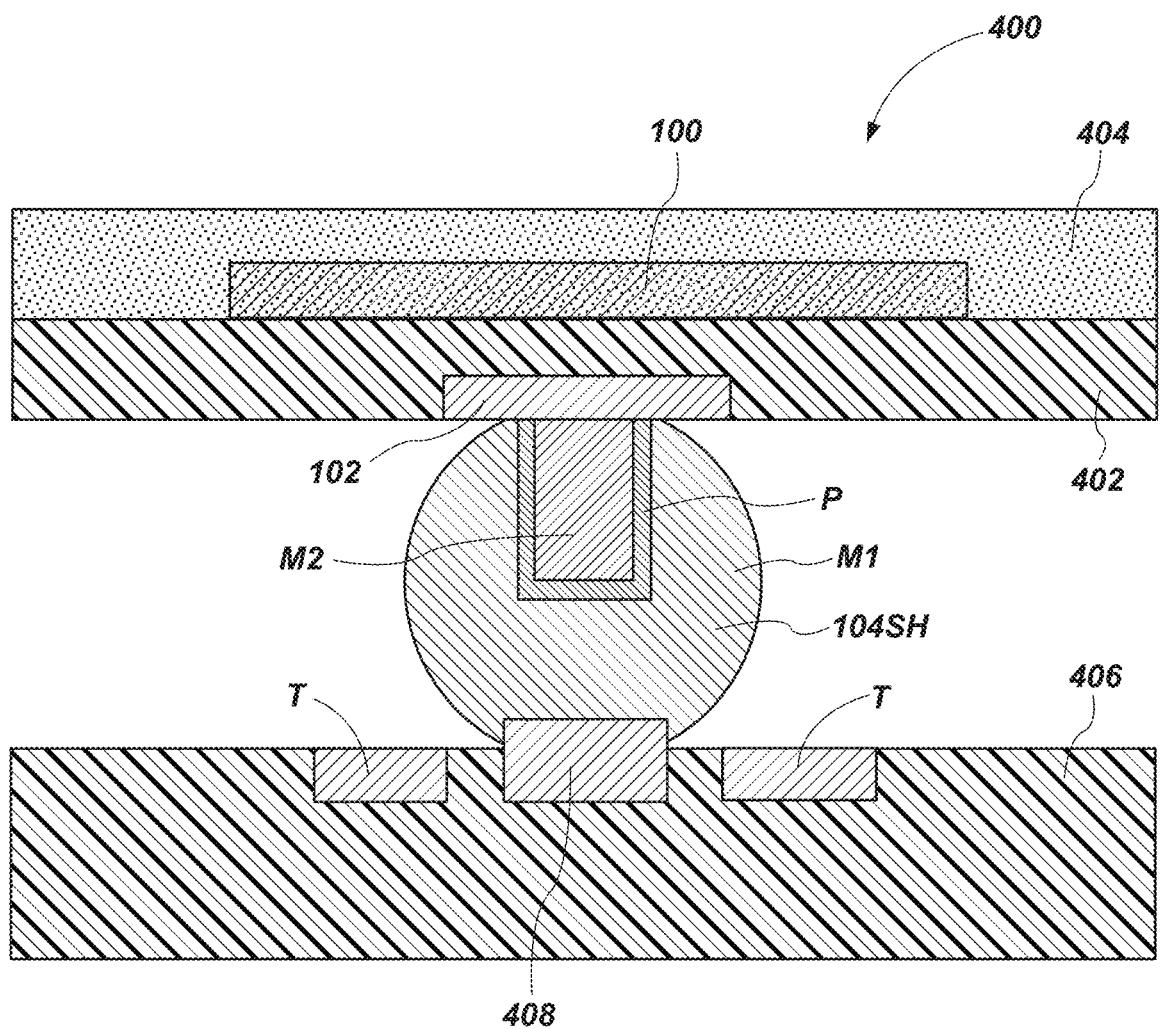
FIG. 4 is a schematic cross-section of an assembly comprising an encapsulated microelectronic component on a substrate connected to higher-level packaging through a solder joint according to embodiments of the disclosure.

Referring to FIG. 4, an example microelectronic component assembly 400 comprises a microelectronic component 100 in the form of a semiconductor die on a substrate 402 (e.g., interposer) and having sides and a back thereof encapsulated in an epoxy molding compound 404 which abuts a surface of substrate 402 on which microelectronic component 100 is mounted. Substrate 402 includes at least one level of conductive traces (not shown) connecting microelectronic component 100 to bond pads 102 (only one shown for clarity). Self-healing solder joint 104SH comprising solder material M1 and solder material M2, the latter residing on and protruding from bond pad 102 and having sides and an outer end surrounded by solder material M1, which also contacts bond pad 102 around a periphery of solder material M2. As shown, a protective coating P surrounds portions of solder material M2 not in contact with bond pad 102. Self-healing solder joint 104SH extends between and is bonded to, both bond pad 102 and terminal pad 408 of another microelectronic component 406 in the form of (for example) a printed circuit board, terminal pad connecting to traces T of the printed circuit board by conductive paths therein (not shown).

In implementation of embodiments of the disclosures, suitable solder materials M1 and M2 may be selected with higher melting points for solder material M1 than for solder material M2. For example, a suitable lead-free solder material M1 may include an Sn—Ag—Cu (SAC) solder comprising 95.5% Sn, 4.0% Ag and 0.5% Cu (all proportions being by weight) having a melting point of 217° C., an Sn—Ag—Cu (SAC) solder comprising 95.5% Sn, 3.8% Ag and 0.7% Cu having a melting point of 217° C., or an Sn—Ag solder comprising 96.5% Sn and 3.5% Ag having a melting point of 221° C. A suitable lead-free solder material M2 may include, for example, Indalloy 1 comprising 50% In and 50% Sn and having a liquidus point of 125° C., Indalloy 1E comprising 52% In and 48% Sn with a liquidus point of 118° C., Indalloy 290 comprising 97% In and 3% Ag with a liquidus point of 143° C., or Indalloy 4 comprising 100% In with a liquidus point of 157° C. Other suitable solder materials for M2 include, by way of example only, Indalloy 2 comprising 80% In, 15% Pb and 5% Ag having a liquidus point of 154° C., and Indalloy 204 comprising 70% In and 30% Pb having a liquidus point of 175° C. Suitable metal materials for protective coating P include, by way of non-limiting example, Ni, W, Pd, Pt, Au, as well as Ni alloyed with, for example, Co, Zn, Cu, or Fe.

Figure 5:
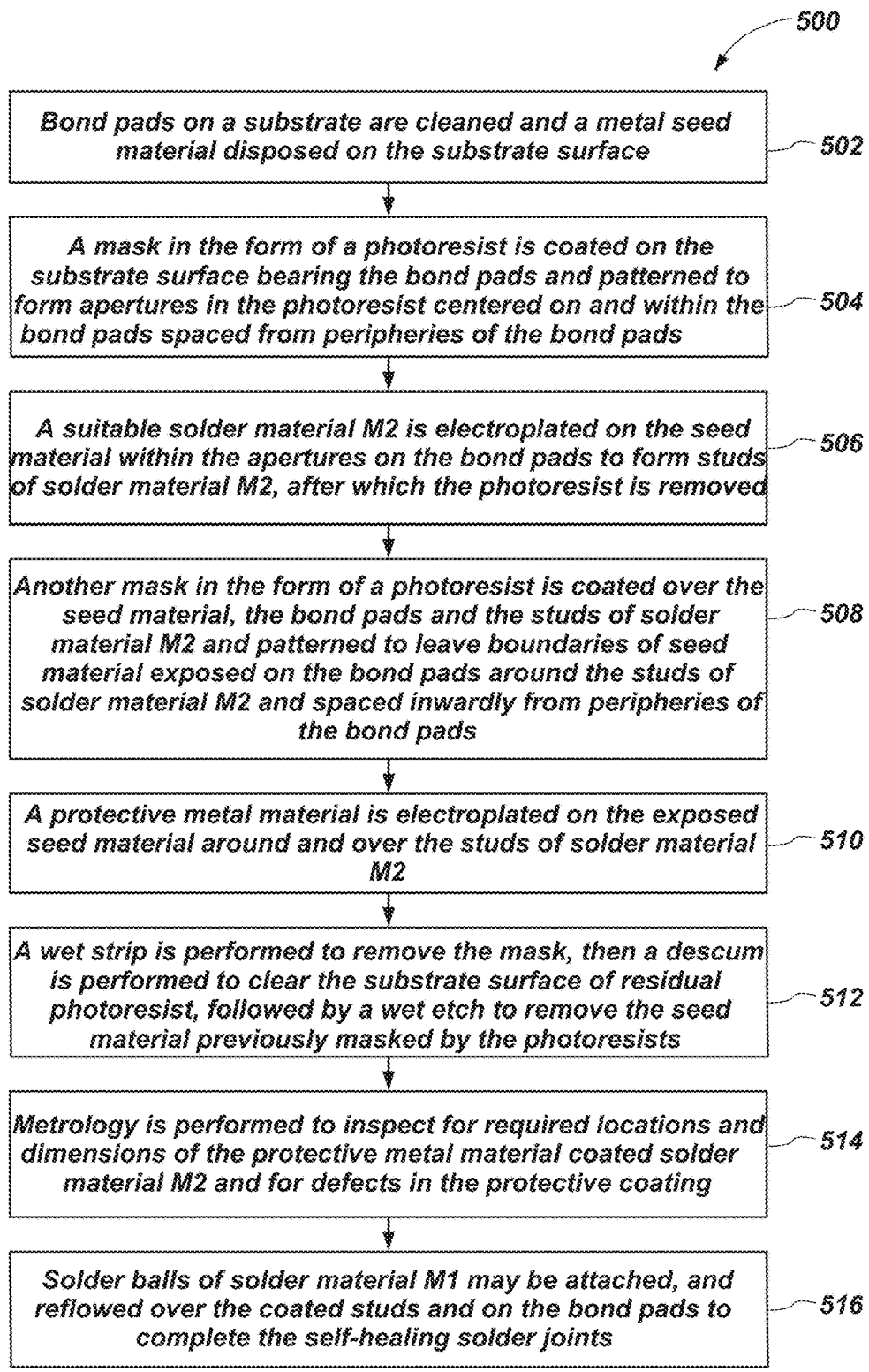
FIG. 5 is a flow diagram of a process for forming solder joints according to embodiments of the disclosure.

Referring now to FIG. 5, a process 500 for forming self-healing solder joints on bond pads comprising a compatible metal or covered with a UBM comprising an exposed compatible metal is depicted. In act 502, bond pads on a substrate surface are cleaned and a metal seed material, for example Ti, Ni, W, Cu, or a solder material such as solder material M2, disposed thereon, as by sputtering. The seed material may be selected for compatibility with a metal material or materials to be electroplated thereon, and additional materials may be employed in combination with a primary seed material for process enhancement (e.g., electroplating adhesion promoter). In act 504, a mask in the form of a photoresist is coated on the substrate surface bearing the bond pads and patterned (such term including subsequent development) to form apertures in the photoresist centered on and within the bond pads spaced from peripheries of the bond pads. In act 506, a suitable solder material M2 is electroplated on the seed material within the apertures on the bond pads to form bumps, which may also be characterized as studs, of solder material M2, after which the photoresist is removed. In act 508, another mask in the form of a photoresist is coated over the seed material, the bond pads and the studs of solder material M2 and patterned to leave boundaries of seed material exposed on the bond pads around the studs of solder material M2 and spaced inwardly from peripheries of the bond pads. In act 510, a protective metal material is electroplated on the exposed seed material around and over the studs of solder material M2. In act 512, a wet strip is performed to remove the other mask and any excess electroplated material, then a descum is performed to clear the substrate surface of residual photoresist, followed by a wet etch to remove the seed material previously masked by the photoresists to prevent shorting between the solder joints. In act 514, metrology is performed to inspect for locations and dimensions of the protective metal material-coated solder material M2 and for defects in the protective coating. In act 516, solder balls of solder material M1 may be attached, and reflowed over the protectively coated studs and on the bond pads to complete the self-healing solder joints. Alternatively the solder material M1 may be electroplated over the protective metal material P. It is also contemplated that, if solder material M1 is electroplated rather than applied as a solder mass and reflowed, that protective material P may be eliminated.

It is also contemplated that other processes for forming self-healing solder joints according to embodiments of the disclosure may be implemented. For example, studs or bumps of a solder material M2 may be formed and enclosed with a protective coating P as described above on conductive pads of one microelectronic component, and a second microelectronic component bearing solder balls of a solder material M1 on conductive pads alignable with the conductive pads of the first microelectronic component may be superimposed on the first microelectronic component with the solder balls contacting the studs or bumps. The solder material M1 may then be heated to reflow, encompass the studs or bumps, and bond to the conductive pads of the first microelectronic component. Further, in some applications, for example package-on-package or stacked die (3Di/2.5Di), the stud of material M2 may be implemented on either a top component or a bottom component, such as on a bottom package or on a bottom (i.e., back side) of a die. In some instances, it may be desirable to fabricate substrates with the studs of solder material M2 and protective material P on the substrate terminal pads, and apply a die or other microelectronic component having solder balls of solder material M1, followed by reflow. In addition, it is contemplated that first and second microelectronic components to be joined may each have a stud of solder material M2 and protective coating P on pads thereof, a solder ball of solder material M2 encompassing both studs upon reflow.

It is further contemplated that self-healing solder joints may be formed independently of a microelectronic component, for example on a carrier substrate, using a process similar to that described with respect to FIG. 5. For example, solder joints may be formed in an array corresponding to a pattern of an array of conductive pads (e.g., bond pads) of a microelectronic component (e.g., semiconductor die) to be bumped. However, metal seed material may be disposed on a temperature-resistant adhesive film on the carrier substrate, for example a UV-sensitive or heat-sensitive film, and self-healing solder joints formed. Subsequently, a ball pickup tool configured with a vacuum head sized and configured to correspond to an array, or multiple arrays, of solder joints may be used to pick the array or arrays of solder joints after the adhesion of the film is weakened, and place the solder joints on a semiconductor die or a group of semiconductor die locations on a wafer, as the case may be. The vacuum head may be configured with a non-solder wettable surface and a resistance heater to heat the applied self-healing solder joints to reflow solder material M1, or a heat gun may be employed for reflow after the self-healing solder joints are released. Alternatively, a focused laser or other energy beam may be raster-scanned across the arrays of self-healing solder joints to reflow.

It is additionally contemplated self-healing solder joints according to embodiments of the disclosure may be formed as described in the preceding paragraph, stripped from the adhesive film, and applied to one or more microelectronic components using, for example, a stencil with apertures aligned with conductive pads of the microelectronic components. To ensure proper alignment of solder material M2 of the self-healing solder joints with the conductive pads, a ferromagnetic Ni or Ni alloy protective coating may be employed, and a magnetic field applied underneath the microelectronic components. Subsequently, a reflow may be conducted as noted above.

Embodiments of the disclosure may be implemented not only for formation of solder joints and microelectronic components, but also for quality assurance and repair. For example, using a solder material M2 having a suitable melting point, potential solder joint failure-induced infant mortality may be reduced during burn-in at, for example, 125° C., an accepted temperature for DRAM burn-in. Similarly, when semiconductor die undergo characterization testing, die exhibiting open circuits may be selectively locally heated for repair. Such local heating may be effected on a cooling chuck to prevent degradation of the integrated circuitry of the die while reaching a desired temperature for melting solder material M2. Alternatively, a group of semiconductor die exhibiting open circuits may be cycled through an oven at, for example, 150° C., for repair. As another alternative, when a defective solder joint or joints of a die are identified, a focused laser or other energy beam may be employed to individual heat such defective solder joints.

It is yet additionally contemplated that embodiments of self-healing solder joints may also be healed during normal operation of microelectronic components or component assemblies employing such self-healing solder joints. For example, during high temperature extremes of thermal cycles in severe operations, high-end operating temperatures may exceed the melting point of a solder material M2, thus automatically initiating self-repair. Further, even harsher and in many instances not easily accessible but operationally demanding environments, such as (for example) are associated with aerospace vehicles, military applications, industrial plants, nuclear reactors and subterranean wellbores with microelectronic component operating temperatures of 150° C. or greater may also benefit from the use of self-healing solder joints according to embodiments of the disclosure.

Figure 6:
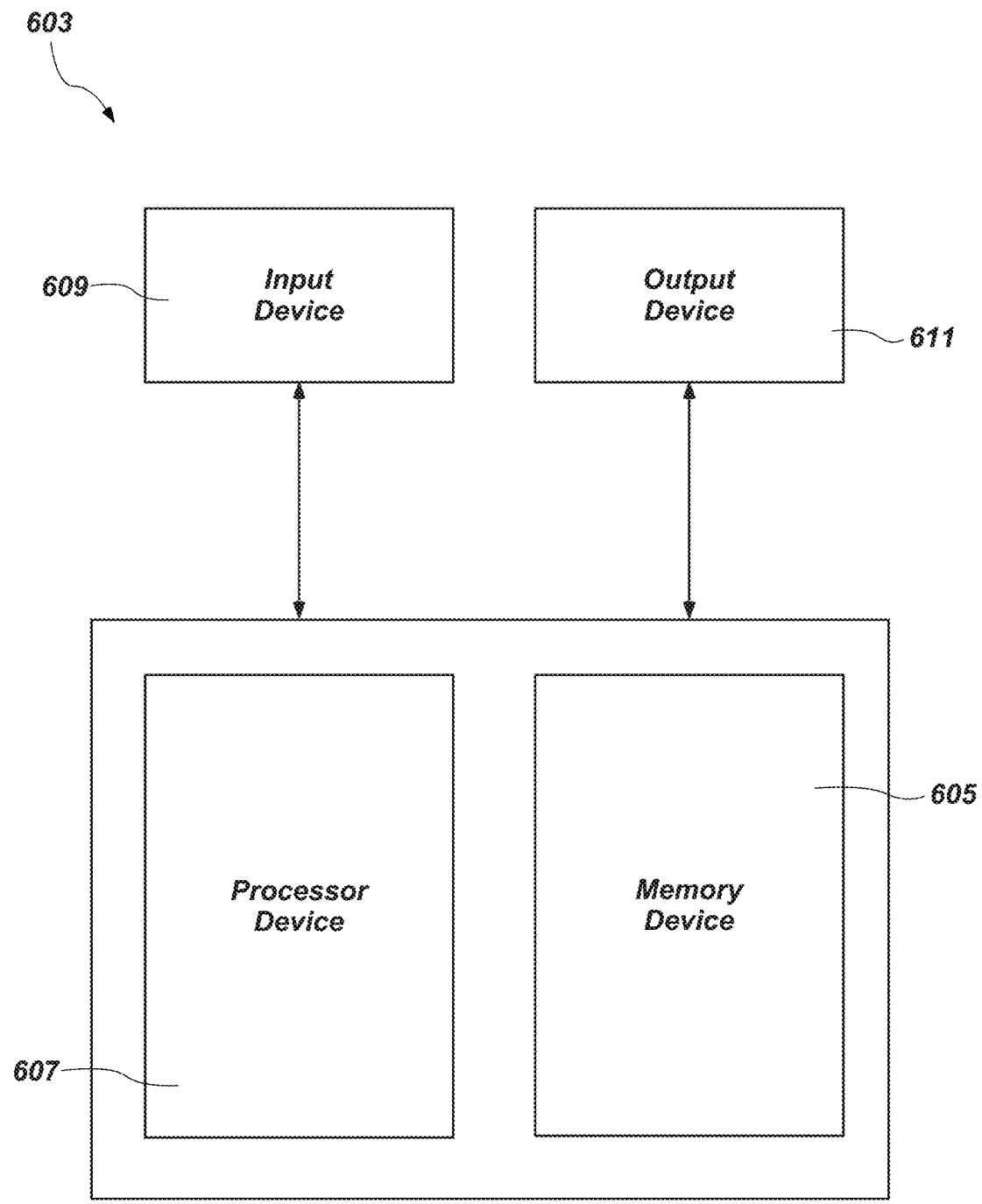
FIG. 6 is a block diagram of an electronic system including microelectronic components including interconnections comprising conductive elements in the form of solder joints according to embodiments of the disclosure.

Microelectronic components including self-healing solder joint structures may be used in embodiments of electronic systems of the disclosure. For example, FIG. 6 is a block diagram of an electronic system 603, in accordance with embodiments of the disclosure. The electronic system 603 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, an automotive infotainment system, a self-driving vehicle control system, etc. The electronic system 603 includes at least one memory device 605. The at least one memory device 605 may include, for example, self-healing solder joints according to embodiments of the disclosure.

The electronic system 603 may further include at least one electronic signal processor device 607 (often referred to as a "microprocessor"). The electronic signal processor device 607 may include self-healing solder joints according to embodiments of the disclosure. The electronic system 603 may further include one or more input devices 609 for inputting information into the electronic system 603 by a user, such as, for example, a mouse or other pointing device, a keyboard, a touchpad, a button, or a control panel. The electronic system 603 may further include one or more output devices 611 for outputting information (e.g., visual or audio output) to a user such as, for example, a monitor, a display, a printer, an audio output jack, a speaker, etc. In some embodiments, the input device 609 and the output device 611 may comprise a single touchscreen device that can be used both to input information to the electronic system 603 and to output visual information to a user. The input device 609 and the output device 611 may communicate electrically with one or more of the memory device 605 and the electronic signal processor device 607. At least some of the foregoing devices may be mounted to one or more substrates, for example an interposer, a motherboard or other circuit board.

Figure 7:
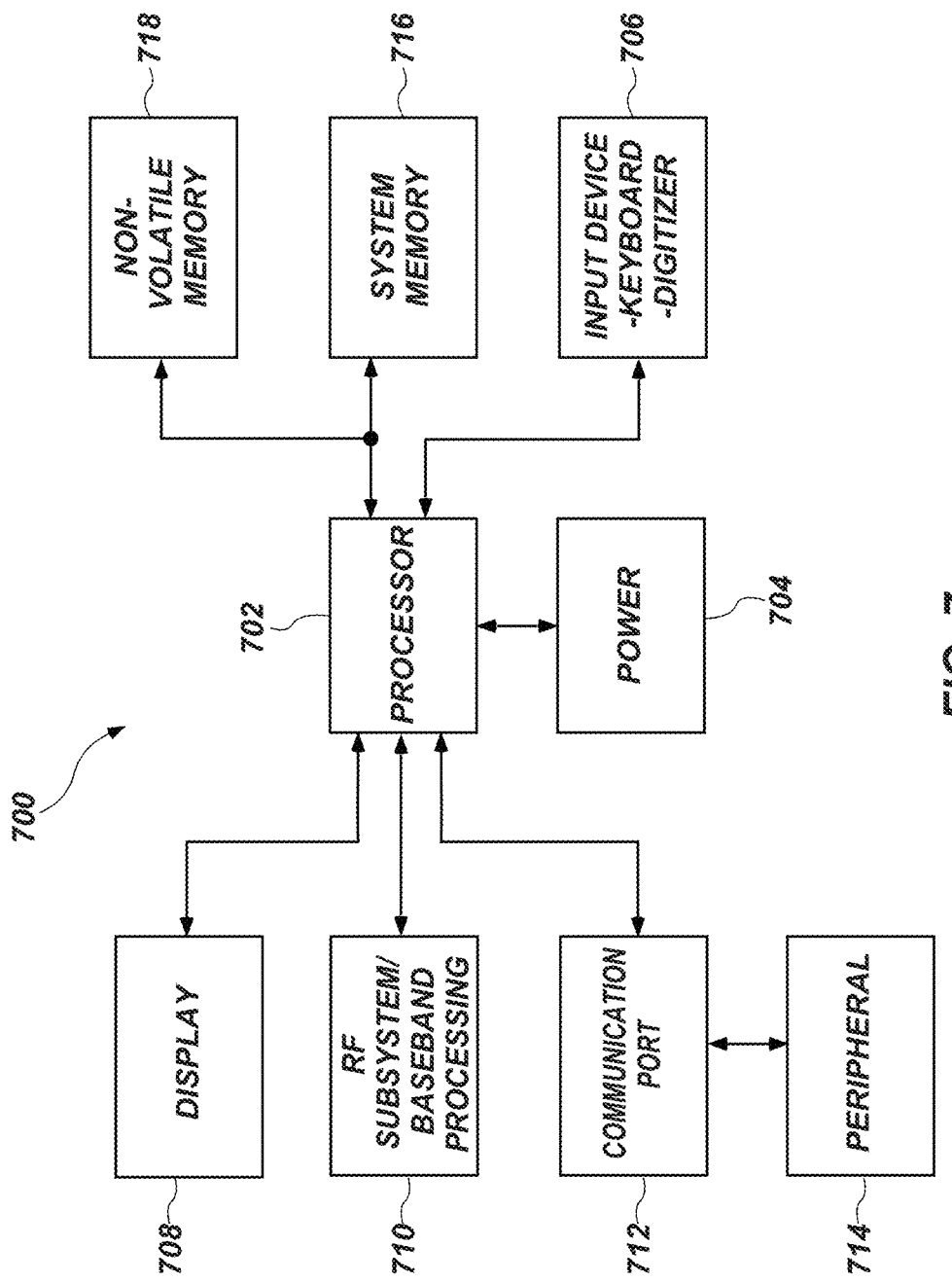
FIG. 7 is a block diagram of a processor-based system depicting additional microelectronic components including interconnections comprising conductive elements in the form of solder joints according to embodiments of the disclosure.

With reference to FIG. 7, depicted is a processor-based system 700. The processor-based system 700 may include various microelectronic components equipped with self-healing solder joints in accordance with embodiments of the disclosure. The processor-based system 700 may be any of a variety of types such as a computer, pager, cellular phone, personal organizer, control circuit, or other electronic device. The processor-based system 700 may include one or more processors 702, such as a microprocessor, to control the processing of system functions and requests in the processor-based system 700. The processor 702 as well as some or all other subcomponents of the processor-based system 700 may include self-healing solder joints for mutual connections and connection to higher-level packaging (e.g., a mother board) in accordance with embodiments of the disclosure.

The processor-based system 700 may include a power supply 704 in operable communication with the processor 702. For example, if the processor-based system 700 is a portable system, the power supply 704 may include one or more of a fuel cell, a power scavenging device, permanent batteries, replaceable batteries, and rechargeable batteries. The power supply 704 may also include an AC adapter; therefore, the processor-based system 700 may be plugged into a wall outlet, for example. The power supply 704 may also include a DC adapter such that the processor-based system 700 may be plugged into a vehicle cigarette lighter or a vehicle power port, for example.

Various other components may be coupled to the processor 702 depending on the functions that the processor-based system 700 performs. For example, a user interface 706 may be coupled to the processor 702. The user interface 706 may include input devices such as buttons, switches, a keyboard, a light pen, a mouse, a digitizer and stylus, a touch screen, a voice recognition system, a microphone, or a combination thereof. A display 708 may also be coupled to the processor 702. The display 708 may include an LCD display, an SED display, a CRT display, a DLP display, a plasma display, an OLED display, an LED display, a three-dimensional projection, an audio display, or a combination thereof. Furthermore, an RF sub-system/baseband processor 710 may also be coupled to the processor 702. The RF sub-system/baseband processor 710 may include an antenna that is coupled to an RF receiver and to an RF transmitter (not shown). A communication port 712, or more than one communication port 712, may also be coupled to the processor 702. The communication port 712 may be adapted to be coupled to one or more peripheral devices 714, such as a modem, a printer, a computer, a scanner, or a camera, or to a network, such as a local area network, remote area network, intranet, or the Internet, for example.

The processor 702 may control the processor-based system 700 by implementing software programs stored in the memory. The software programs may include an operating system, database software, drafting software, word processing software, media editing software, or media playing software, for example. The memory is operably coupled to the processor 702 to store and facilitate execution of various programs. For example, the processor 702 may be coupled to system memory 716, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 716 may include volatile memory, non-volatile memory, or a combination thereof. The system memory 716 is typically large so that it can store dynamically loaded applications and data. In some embodiments, the system memory 716 may include one or more microelectronic components equipped with self-healing solder joints in accordance with embodiments of the disclosure.

The processor 702 may also be coupled to non-volatile memory 718, which is not to suggest that system memory 716 is necessarily volatile. The non-volatile memory 718 may include one or more of STT-MRAM, MRAM, read-only memory (ROM) such as an EPROM, resistive read-only memory (RROM), and flash memory to be used in conjunction with the system memory 716. The size of the non-volatile memory 718 is typically selected to be just large enough to store any necessary operating system, application programs, and fixed data. Additionally, the non-volatile memory 718 may include a high-capacity memory such as disk drive memory, such as a hybrid-drive including resistive memory or other types of non-volatile solid-state memory, for example. The non-volatile memory 718 may include microelectronic components equipped with self-healing solder joints in accordance with embodiments of the disclosure.

As will be appreciated by those of ordinary skill in the art, embodiments of the disclosure provide significant advantages for microelectronic component assemblies and electronic systems in comparison to those employing conventional solder joints. The self-healing solder joint structures may be easily implemented using existing processes, materials and equipment. Further, infant mortality experienced during burn-in and thermal cycle testing may be reduced. In addition, microelectronic component assemblies may exhibit increased operational longevity in high thermal stress environments. Due to the self-healing, remedial nature of solder joints of embodiments of the disclosure, reduced solder ball pitch, ball size and bond line thickness attendant to smaller component form factors may be accomplished without sacrificing reliability as is the normal case with the reduced solder mass of conventional reduced-pitch, reduced-size solder joints.

In embodiments, a microelectronic component comprises a substrate having at least one bond pad on a surface thereof and a solder joint on the at least one bond pad. The solder joint comprises a first solder material having a first melting point contacting and protruding from the at least one bond pad and a second solder material within the first solder material contacting and protruding from the at least one bond pad, the second solder material being in a solid state at ambient temperature and having a second melting point lower than the first melting point.

In embodiments, a process for forming self-healing solder joints comprises cleaning bond pads on a substrate surface, disposing a metal seed material over the substrate surface, coating and patterning a mask material on the substrate surface to form apertures in the mask material centered on and within the bond pads spaced from peripheries of the bond pads, electroplating a solder material in the apertures on the bond pads and removing the mask material. The process further comprises coating and patterning another mask material on the substrate surface to leave boundaries of the metal seed material exposed around the solder material and spaced inwardly from peripheries of the bond pads, electroplating a protective metal material on the exposed seed material around and over the solder material, removing the other mask material and removing previously masked seed material on the substrate surface. Metrology is performed to inspect for locations and dimensions of the protective metal-covered solder material and for defects in the protective metal material coating and solder balls of another, different solder material are attached and reflowed over the protective metal material and on the bond pads.

In embodiments, a microelectronic component assembly comprises a first microelectronic component, a second microelectronic component at least partially superimposed over the first microelectronic component and solder joints extending between and bonded to aligned conductive pads of the first microelectronic component and the second microelectronic component. The solder joints comprise two different solder materials including an outer solder material having a first melting point and an inner solder material having a second, lower melting point, the second solder material being in a solid state at substantially ambient temperature.

In embodiments, an electronic system comprises microelectronic components in the form of one or more input devices, one or more output devices, one or more signal processor devices, one or more memory devices and at least one substrate having mounted thereto at least some of the foregoing devices. Electrical connections between at least two of the microelectronic components comprise solder joints comprising two different solder materials having different melting points, each of which solder materials is in a solid state at substantially ambient temperature.

In embodiments, a solder joint comprises a solder material having a first melting point, a protective metal material covering surfaces of the solder material and another solder material over the protective metal material having a second melting point higher than the first melting point and lower than a melting point of the protective metal material.

In embodiments, a repair process comprises heating at least a portion of a microelectronic component having self-healing solder joints, at least one of the self-healing solder joints having a crack through an outer solder material having a relatively higher melting point extending to an inner solder material having a relatively lower melting point to a temperature sufficiently high to transform the inner solder material from a solid state to a flowable state, enter the crack and react with the outer solder material.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A microelectronic component, comprising:
a substrate having at least one bond pad on a surface thereof; and
a solder joint on the at least one bond pad and comprising:
a first solder material having a first melting point;
a second solder material having a bottom surface directly contacting the at least one bond pad, the second solder material protruding into and enclosed within the first solder material, the second solder material being in a solid state at substantially ambient temperature and having a second melting point lower than the first melting point; and
a protective coating of a metal or metal alloy over the second solder material and extending to and in contact with the at least one bond pad only peripherally about the second solder material, the protective coating having a melting point higher than the first melting point or the second melting point;
the first solder material directly contacting the at least one bond pad only peripherally around the protective coating.

2. The microelectronic component of claim 1, wherein the first solder material comprises an Sn—Ag—Cu (SAC) solder comprising 95.5% Sn, 4.0% Ag and 0.5% Cu, an Sn—Ag—Cu (SAC) solder comprising 95.5% Sn, 3.8% Ag and 0.7% Cu, or an Sn—Ag solder comprising 96.5% Sn and 3.5% Ag.

3. The microelectronic component of claim 1, wherein the second solder material comprises an Indalloy 1 solder comprising 50% In and 50% Sn, an Indalloy 1E solder comprising 52% In and 48% Sn, an Indalloy 290 solder comprising 97% In and 3% Ag, or an Indalloy 4 solder comprising 100% In.

4. The microelectronic component of claim 1, wherein the metal or metal alloy comprises Ni, W, Pd, Pt, Au, or an alloy of Ni and Co, Zn, Cu, or Fe.

5. The microelectronic component of claim 1, wherein the second solder material is configured as a stud protruding from a center of the at least one bond pad remote from a periphery thereof, and the first solder material is configured substantially as a ball, extends over an outer surface of the stud and contacts the at least one bond pad peripherally around the stud.

6. The microelectronic component of claim 1, wherein the second solder material is formulated to transform from the solid state to a flowable state when the microelectronic component is exposed to a selected temperature higher than ambient and lower than the first melting point.

7. The microelectronic component of claim 6, wherein the second solder material is formulated to, when in a flowable state, react with the first solder material to form an intermetallic compound or a solder alloy having a higher melting point than either the first melting point or the second melting point.

8. A microelectronic component assembly, comprising:
a first microelectronic component;
a second microelectronic component at least partially superimposed over the first microelectronic component;
solder joints extending between aligned conductive pads of the first microelectronic component and the second microelectronic component, the solder joints comprising two different solder materials including an outer solder material having a first melting point and extending between aligned conductive pads of the first microelectronic component and the second microelectronic component and an inner solder material having a flat surface contacting and bonded directly to conductive pads of only one of the first microelectronic component and the second microelectronic component, the inner solder material protruding into and surrounded by the outer solder material, the outer solder material having a flat surface bonded directly to a conductive pad of another of the first and second microelectronic components and a flat annular surface bonded directly to an aligned conductive pad of the only one of the first and second microelectronic components only outside of a contact area of the flat surface of the inner solder material with the aligned conductive pad, the inner solder material having a second, lower melting point, the inner solder material being in a solid state at substantially ambient temperature; and
a protective coating of a metal or metal alloy extending from conductive pads contacted by the inner solder material, surrounding at least sides of the inner solder material and in only peripheral contact with the conductive pads of the only one of the first microelectronic component and the second microelectronic component, the metal or metal alloy having a higher melting point than the first and second melting points.

9. The microelectronic component assembly of claim 8, wherein the protective coating of a metal or metal alloy covers all portions of the inner solder material not in contact with a conductive pad.

10. A microelectronic component assembly, comprising:
a first microelectronic component;
a second microelectronic component at least partially superimposed over the first microelectronic component; and
solder joints extending between aligned conductive pads of the first microelectronic component and the second microelectronic component, the solder joints comprising two different solder materials including an outer solder material having a first melting point and extending between aligned conductive pads of the first microelectronic component and the second microelectronic component and an inner solder material having a flat surface contacting and bonded directly to conductive pads of only one of the first microelectronic component and the second microelectronic component, the inner solder material protruding into and surrounded by the outer solder material, the outer solder material having a flat surface bonded directly to a conductive pad of another of the first and second microelectronic components and a flat annular surface bonded directly to an aligned conductive pad of the only one of the first and second microelectronic components only outside of a contact area of the flat surface of the inner solder material with the aligned conductive pad, the inner solder material having a second, lower melting point, the inner solder material being in a solid state at substantially ambient temperature;

wherein at least one of the solder joints exhibits a crack extending from an outer surface of the outer solder material into the solder joint and into the inner solder material, and an intermetallic compound or a solder alloy comprising a reaction product of the outer solder material and the inner solder material fills at least a portion of the crack;

wherein the at least one of the solder joints further comprises a protective metal or metal alloy between a portion of the outer solder material and an exposed portion of the inner solder material, the protective metal or metal alloy having a melting point higher than the first melting point and the second melting point, and the crack extends through a portion of the protective metal or metal alloy between the outer solder material and the inner solder material.

* * * * *